US007541678B2

(12) United States Patent
Nishida

(10) Patent No.: US 7,541,678 B2
(45) Date of Patent: Jun. 2, 2009

(54) PRINTED WIRING BOARD, INFORMATION PROCESSING APPARATUS, AND METHOD OF MANUFACTURING THE PRINTED WIRING BOARD

(75) Inventor: Yoshihiro Nishida, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 11/144,717

(22) Filed: Jun. 6, 2005

(65) Prior Publication Data
US 2006/0076683 A1  Apr. 13, 2006

(30) Foreign Application Priority Data
Sep. 30, 2004  (JP) .............. 2004-287091

(51) Int. Cl.
*H01L 23/48* (2006.01)
*H01L 23/52* (2006.01)
*H01L 29/40* (2006.01)

(52) U.S. Cl. .............. 257/758; 257/786; 257/776; 257/773; 361/777; 361/778

(58) Field of Classification Search ............. 257/98, 257/116, 746, 748, 431–432, 435, 428, 701, 257/703, 758, E23.112, 786, 776, 773; 361/748, 361/760–761, 767, 772, 820, 777, 778
See application file for complete search history.

(56) References Cited

U.S. PATENT DOCUMENTS 5,334,800 A * 8/1994 Kenney ............ 174/250
5,348,792 A * 9/1994 Hattori et al. ............ 428/209
5,682,124 A * 10/1997 Suski ............ 333/1
6,707,682 B2 * 3/2004 Akiba et al. ............ 361/763
7,292,454 B2 * 11/2007 Farkas et al. ............ 361/784
2005/0146403 A1 * 7/2005 Okubora ............ 333/247

FOREIGN PATENT DOCUMENTS

JP  2003-535743  12/2003
WO  WO 01/94134 A1  12/2001

OTHER PUBLICATIONS

Intel, "PCI Express Board Design Guidelines—Draft," Intel Corporation, http://www.express-lane.org, p. 1-41, (2003).

* cited by examiner

*Primary Examiner*—Phuc T Dang
*Assistant Examiner*—Thanh Y Tran
(74) *Attorney, Agent, or Firm*—Pillsbury Winthrop Shaw Pittman, LLP

(57) ABSTRACT

Disclosed is a printed wiring board comprising an insulating layer having a rectangular flat shape and provided with fibers in the layer, the direction of the fiber in the layer being almost parallel to any side of the rectangle, a reference potential layer disposed on one surface side of the insulating layer, a plurality of wiring patterns for signal transmission disposed on the other surface side of the insulating layer so as to have nearly similar angles respectively with respect to the direction of the fiber in the insulating layer, and a pad portion to mount a semiconductor device, disposed on the other surface side of the insulating layer to conduct the plurality of wiring patterns.

7 Claims, 8 Drawing Sheets

PRINTED WIRING BOARD, INFORMATION PROCESSING APPARATUS, AND METHOD OF MANUFACTURING THE PRINTED WIRING BOARD

CROSS-REFERENCE TO THE INVENTION

This application is based upon and claims the benefit of priority from the prior Japanese Patent Application No. 2004-287091, filed on Sep. 30, 2004; the entire contents of which are incorporated herein by reference.

BACKGROUND

1. Field of the Invention

The present invention relates to a printed wiring board, an information processing apparatus provided with this printed wiring board, and a method of manufacturing the printed wiring board.

2. Description of the Related Art

In recent years, printed wiring boards to mount densely integrated semiconductor devices such as hybrid ICs, MCMs (Multi Chip Modules), and the like have been made denser using a greater number of layers or finer patterns and have greatly contributed to the reduction in size and weight of electronic equipment as densely packed circuit boards in electronic parts.

In such a printed wiring board designed to be so dense, in order to ensure connection reliability, a technology to restrain cracking or the like in the wiring pattern due to stress or the like added from outside by a structure in which the excurrent direction of prepreg fiber (direction of fiber) used as an insulating layer is slanted, for instance, by 45 degrees with respect to a side of the substrate body, is proposed (for instance, Patent Document 1).

[Patent Document 1] Japanese translated application of PCT International Application (P2002-501676=JP-A 2003-535743=WO 01/094134 A)

However, in the case of the printed wiring board described in the above-document, since a rectangular shape of the printed wiring board needs to be cut down and hauled out from a parent material being an insulating layer in a state having an angle with respect to the direction of fiber, much of the parent material is left as scrap, which poses a problem in terms of manufacturing costs.

On the other hand, when a printed wiring board which obtains an insulating layer from prepreg and the like is used as a controlling board which requires high speed data transmission, the following problem becomes apparent: the transmission characteristics of the signals carried by wiring patterns deteriorate in a printed wiring board having a ground layer and a plurality of wiring patterns for signal transmission positioned facing to the ground layer while sandwiching a fiber-containing insulating layer.

Concretely, a wiring pattern wired right above the fibers along the direction of fiber in the insulating layer and a wiring pattern wired at a position away from right above the fibers differ in capacitance created between their respective ground layers (thickness direction of the substrate). Accordingly, impedance in the extending direction of the wiring pattern (transmitting direction of signal) differs between the former wiring pattern and the latter wiring pattern, which creates differences in signal transmission speed or signal noise. These phenomena become more apparent as the signal transmission speed increases.

SUMMARY

It is an object of the present invention to provide a printed wiring board, an information processing apparatus, and a method of manufacturing the printed wiring board, which can keep manufacturing costs low and realize stable transmission of signals.

The printed wiring board relating to the present invention comprises: an insulating layer having a rectangular flat shape and provided with fibers in the layer, a direction of the fiber in the layer being almost parallel to any side of the rectangle; a reference potential layer disposed on one surface side of the insulating layer; a plurality of wiring patterns for signal transmission disposed on another surface side of the insulating layer so as to have nearly similar crossing angles respectively with respect to the direction of the fiber in the insulating layer; and a pad portion to mount a semiconductor device, disposed on the other surface side of the insulating layer to conduct the plurality of wiring patterns.

A method of manufacturing a printed wiring board relating to the present invention comprises: cutting down an insulating layer provided with fiber in the layer in a rectangular shape such that any side thereof is almost parallel to a direction of the fiber; and patterning a conductive layer provided on one surface of the insulating layer into a plurality of patterns having nearly similar angles respectively with respect to the direction of the fiber in the insulating layer.

According to the present invention, it is possible to provide a printed wiring board, an information processing apparatus, and a method of manufacturing the printed wiring board, which can keep manufacturing costs low, and realize stable transmission of signals.

DETAILED DESCRIPTION

EXPLANATION OF EMBODIMENTS

Embodiments of the present invention will be described with reference to the drawings, but these drawings are presented only for the illustrative purpose and in no respect are intended to limit the present invention.

Embodiments to implement the present invention will be explained based on the drawings as follows.

First Embodiment

Figure 1:
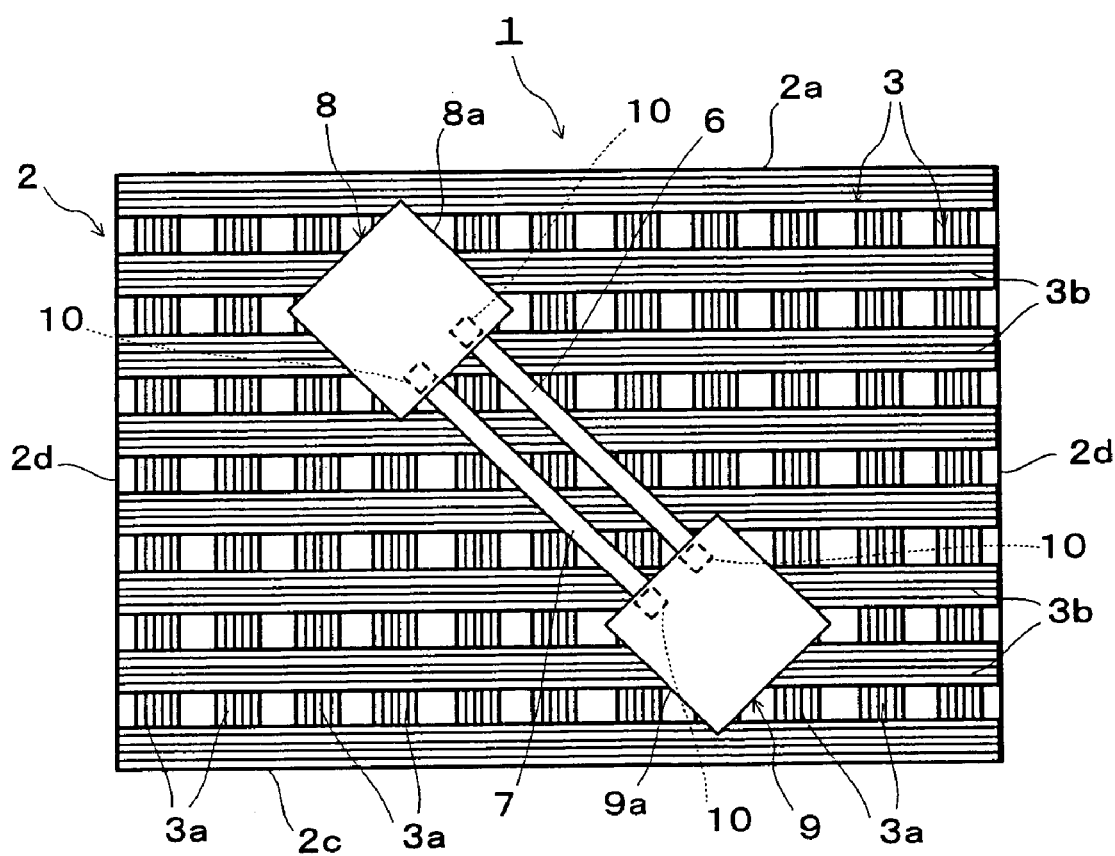
FIG. 1 is a plan view schematically showing a state that a semiconductor package is mounted on a printed wiring board according to a first embodiment of the present invention.
Figure 2:
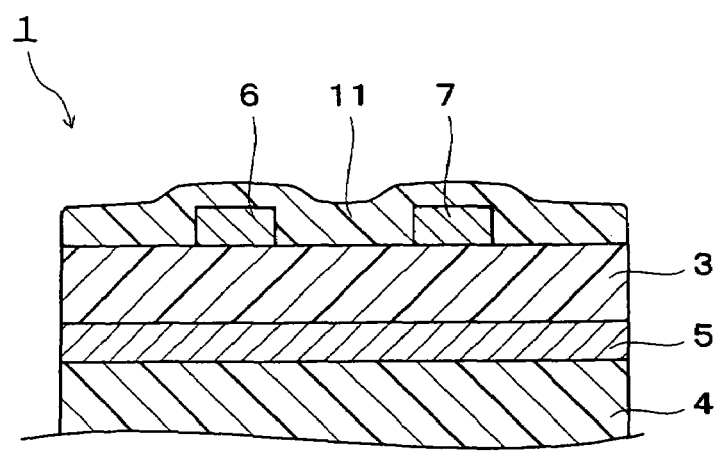
FIG. 2 is a sectional view of the printed wiring board shown in FIG. 1.

FIG. 1 is a plan view schematically showing a state that a semiconductor package is mounted on a printed wiring board according to a first embodiment of the present invention, and FIG. 2 is a sectional view of the printed wiring board shown in FIG. 1 (the semiconductor package is not shown). Here, in order to make the internal formation of this printed wiring board clear, FIG. 1 illustrates its structure in perspective.

As shown in FIGS. 1 and 2, the printed wiring board 1 is a multi-layered substrate having a plurality of conductive layers, and is composed of a substrate body 2 having a rectangular appearance. The substrate body 2 of the printed wiring board 1 includes insulating layers 3 and 4, a ground (GND) layer 5 which is an example as a reference potential layer, a plurality of wiring patterns 6 and 7 for signal transmission, and a plurality of pad sections 10 to solder-mount rectangular semiconductor packages 8 and 9 on the substrate body 2.

The above-described insulating layer 3 is formed by hardening prepreg. The fiber components (fiber cluster) 3a and 3b contained in the layer run almost parallel to any one of side portions (edge faces) 2a, 2b, 2c and 2d of the substrate body 2 (in a plane of the substrate body 2). An example of the above-described prepreg is a sheet-like substance made of carbon fiber, glass fiber or aramid fiber, etc. impregnated with thermosetting resin (epoxy resin, for instance) before hardening. The insulating layer 3 made of this prepreg has a bi-directional fiber in which the fiber components 3a and 3b in the layer intersect respectively in a grid pattern. In other words, the insulating layer 3 has portions both thin and thick in density in a plane of the substrate.

The ground layer 5 is layered to cover one entire surface (a bottom surface of the insulating layer 3 in FIG. 2) of the insulating layer 3, as shown in FIG. 2. In the present embodiment, the ground layer 5 is shown as an example of the reference potential layer, but the reference potential layer is not limited to the ground layer 5. An voltage supply source layer can also be used so long as it is a conductive layer covering at least a region facing the wiring patterns 6 and 7 via the insulating layer 3.

The wiring patterns 6 and 7 for signal transmission are respectively disposed at positions facing the ground layer 5 across the insulating layer 3 as shown in FIG. 2. The wiring patterns 6 and 7 are wired having nearly similar angles (obliquely-crossing angles) with respect to the directions of the fiber components 3a and 3b in the insulating layer 3 respectively, as shown in FIG. 1. In detail, the wiring patterns 6 and 7 are wired having nearly 45 degrees respectively with respect to the directions of the fiber components 3a and 3b. In addition, the wiring patterns 6 and 7 are wired on one surface layer of the printed wiring board 1 (substrate body 2), and the surface is covered with a solder resist 11.

The plurality of pad portions 10 to mount the semiconductor packages 8 and 9 are provided on the surface layer (the uppermost surface in FIG. 2) of the printed wiring board 1, and are connected to respective end portions of the wiring patterns 6 and 7, as shown in FIG. 1. The semiconductor packages 8 and 9 mounted on the pad portions 10 via solder bumps are installed on the printed wiring board (PWB) 1 such that their own sides 8a and 9a are positioned 45 degrees to the sides 2a, 2b, 2c and 2d of the substrate body 2 so as to correspond with the 45° setting angle of the wiring patterns 6 and 7. Thus, a printed circuit board (PCB) is structured.

When the above-described printed wiring board 1 is manufactured, the insulating layer 3 is cut down from a parent material in a rectangular shape so that any sides thereof are almost parallel to the directions of the fiber components 3a and 3b in the insulating layer 3 first. Then, the ground layer 5 is provided on one surface side of the insulating layer 3 on this substrate, and the wiring patterns 6 and 7 are formed on the other surface side facing the ground layer 5 via the insulating layer 3 so as to have angles of 45 degrees respectively with respect to the directions of the fiber components 3a and 3b in the insulating layer 3. At this time, the pad portions 10 for the rectangular semiconductor packages 8 and 9 mounted at an angle of 45 degrees with respect to the sides of the insulating layer 3 can be formed so as to correspond with formation angles of the wiring patterns 6 and 7. The printed wiring board 1 can be obtained in this manner. It should be noted that the cutting of the insulating layer 3 and the formation of the ground layer 5 and the wiring patterns 6 and 7 can be reversed in order.

Figure 3:
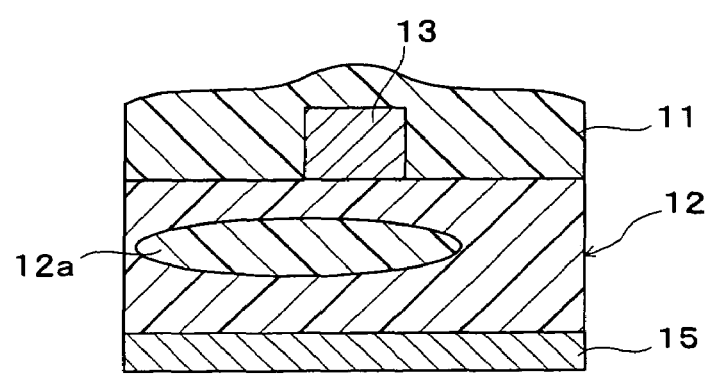
FIG. 3 is a sectional view showing a state that a wiring pattern is disposed right above a fiber component in an insulating layer.
Figure 4:
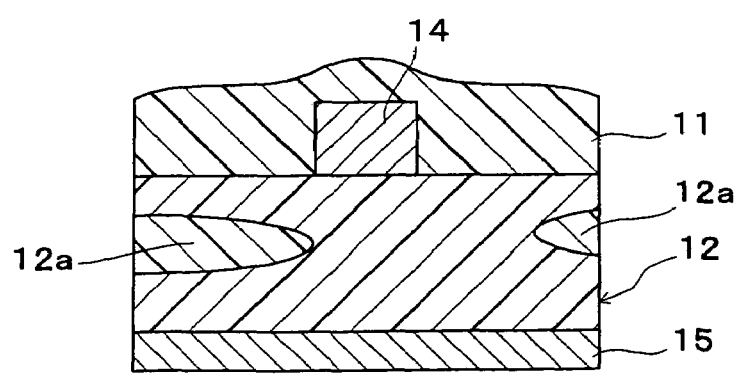
FIG. 4 is a sectional view showing a state in which a wiring pattern is disposed away from right above the fiber component in the insulating layer.
Figure 5:
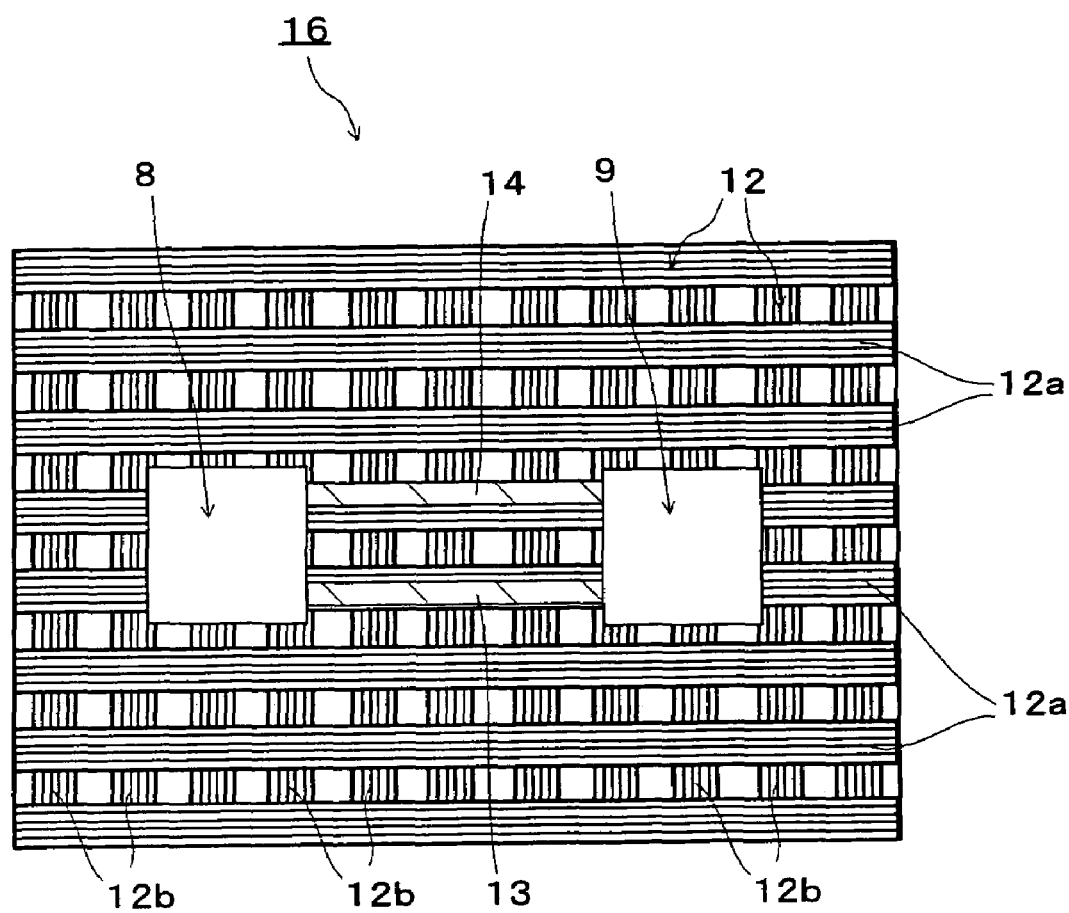
FIG. 5 is a plan view showing a printed wiring board in which a plurality of wiring patterns for signal transmission are respectively wired in parallel with the direction of fiber in the insulating layer.

Next, a structure of the printed wiring board 1 of this embodiment to realize stable transmission of signals while keeping the manufacturing costs inexpensive will be explained in detail based on FIGS. 3 to 6, in addition to FIGS. 1 and 2. Here, FIG. 3 shows a sectional view showing a state in that a wiring pattern is disposed right above a fiber component in an insulating layer, and FIG. 4 is a sectional view showing a state in that a wiring pattern is disposed away from right above a fiber component in an insulating layer. FIG. 5 is a plan view showing a printed wiring board in which a plurality of wiring patterns for signal transmission are respectively wired in parallel with the direction of fibers in the insulating layer, and FIG. 6 is a plan view showing a printed wiring board in which the direction of fibers in an insulating layer is set to 45 degrees with respect to a side of a substrate body.

Between a wiring pattern 13 wired right above a fiber component 12a in an insulating layer 12 as shown in FIG. 3, and a wiring pattern 14 wired in a position avoiding right above the fiber component 12a in the insulating layer 12 as shown in FIG. 4, capacitance formed between a ground layer 15 and the respective wiring patterns 13 and 14 differs from each other. In this case, between the wiring pattern 13 and the wiring pattern 14, impedance differs from each other in the directions along which these patterns extend, in other words, in the direction of signal transmission, and difference in signal transmission speed, or signal noise can be generated. Accordingly, as shown in FIG. 5, a printed wiring board 16 in which the wiring patterns 13 and 14 for signal transmission are wired in parallel with the directions of the fiber components 12a and 12b in the insulating layer 12 respectively may worsen signal transmission characteristics.

The respective wiring patterns 6 and 7 for signal transmission facing the ground layer 5 via the insulating layer 3 are designed to be disposed on the printed wiring board 1 of the present embodiment respectively, crossing the fibers in the insulating layer 3 almost equally (from the slanting direction of 45 degrees) as shown in FIG. 1. Accordingly, it becomes possible to make the capacitance generated between the ground layer 5 and the respective wiring patterns 6 and 7 uniform. Thereby, it becomes possible to align impedance in the direction along which the wiring patterns 6 and 7 extend, so that stable transmission of signals can be realized. Since the wiring patterns 6 and 7 are wired at angles of 45 degrees respectively with respect to the direction of the fiber components 3a and 3b in the insulating layer 3 as described above, the printed wiring board 1 of the present embodiment is serviceable not only when fiber components in the insulating layer are one directional fibers but also when as the insulating layer 3 in the present embodiment, the fiber components in the insulating layer are bi-directional ones respectively intersecting at right angles in a grid pattern. In other words, respective wiring patterns for signal transmission can be equally crossed from a slanting direction of 45 degrees for any of fiber clusters disposed longitudinally and latitudinally in the insulating layer respectively.

Figure 6:
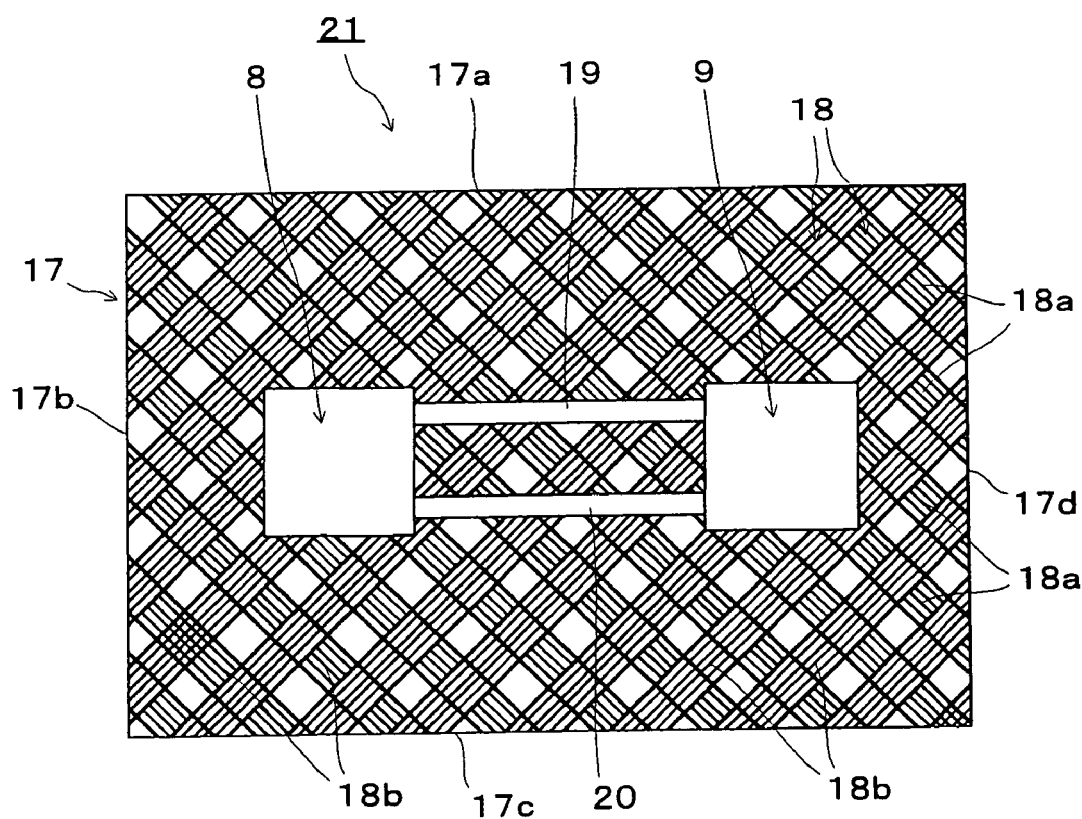
FIG. 6 is a plan view showing a printed wiring board in which the direction of fiber in the insulating layer is set to 45 degrees with respect to a side of the substrate body.

Even with a printed wiring board 21, in a case of forming it as shown in FIG. 6, in other words, when the fiber direction in an insulating layer 17 is tilted at 45 degrees with respect to side portions 17a, 17b, 17c and 17d of a substrate body 17, and the side portions 17a and 17c of the substrate body 17 are disposed in parallel with respective wiring patterns 19 and 20, it is expected that the same effect as that realized by the printed wiring board 1 of the present embodiment can be obtained. However, in the case of the printed wiring board 21, since it is required that a rectangular shape of the substrate body 17 be cut down from a parent material in a slanted state at 45 degrees, much of the parent material is left as scrap, which pose a problem in manufacturing costs.

On the other hand, the printed wiring board 1 of the present embodiment does not require a rectangular shape of the printed wiring board 1 to be cut down with an inclination with respect to the parent material, and does not leave much scrap of the parent material after the cutting. Accordingly, the rectangular shape of the printed wiring board can effectively be cut out from the parent material side, which results in lower manufacturing costs. Thus, the printed wiring board 1 according to the present embodiment can keep the manufacturing costs inexpensive, and at the same time, can stabilize data transmission.

The printed wiring board 1 of the present embodiment can be structured on the assumption of applying, for example, PCI Express which is a bus standard for PCI-SIG. The PCI Express performs data transmission serially using a one-way exclusive bus for ascending and descending as one unit, and its basic communication speed is 2.5 Gbps. In addition to this, since the PCI Express can use plural pieces of buses tied up in a bundle, it is possible to realize a communication speed of 80 Gbps by using, for example, 32 lanes in a bundle. Here, the printed wiring board 1 of the present embodiment structured so as to align the impedance in an extending direction (in the direction of signal transmission) of the wiring patterns 6 and 7 effectively works when a high speed data transmission in a GHz band such as the PCI Express is required.

Second Embodiment

Figure 7:
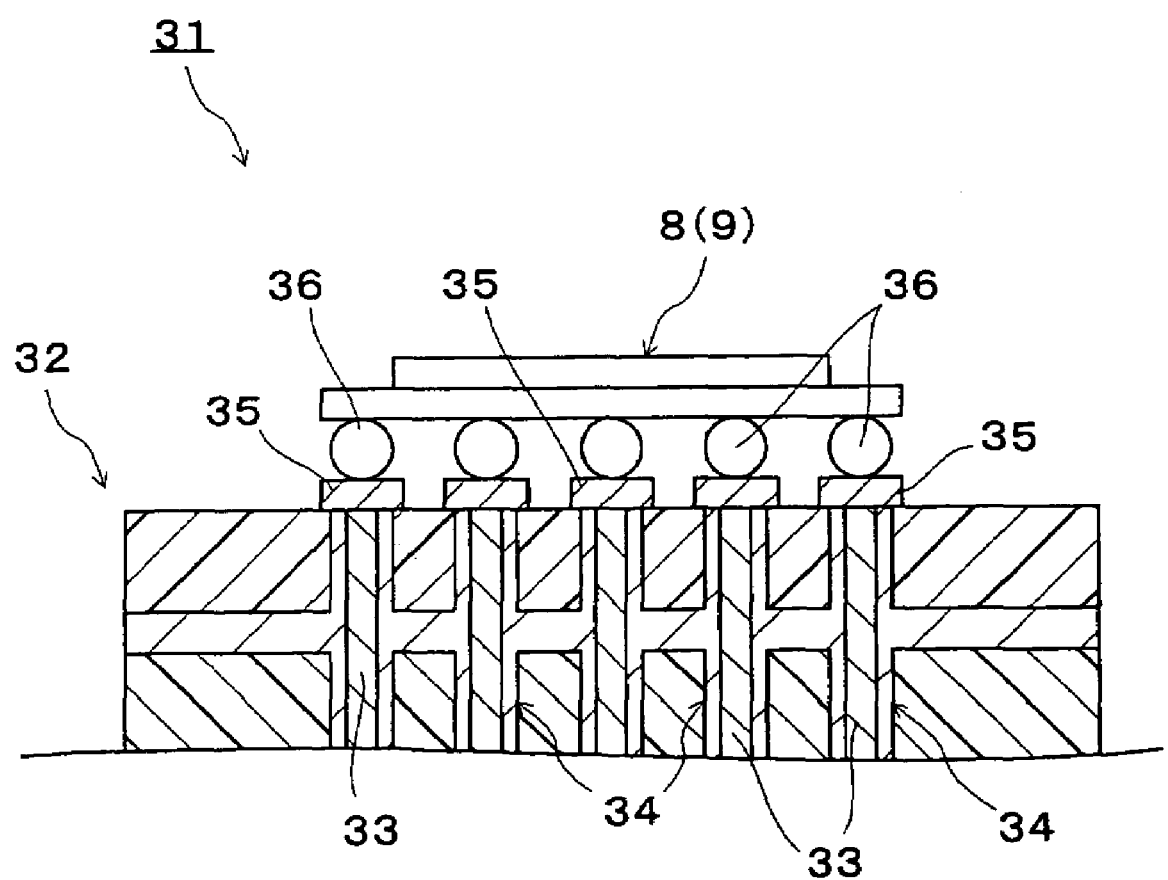
FIG. 7 is a sectional view showing a printed wiring board according to a second embodiment of the present invention.

A second embodiment of the present invention will be explained based on FIG. 7 next. Here, FIG. 7 is a sectional view showing a printed wiring board of the second embodiment. A printed wiring board 31 according to this embodiment is a modification of the structure of the printed wiring board 1 explained in the first embodiment in a peripheral structure of a pad portion on the surface layer of the substrate body.

That is, this printed wiring board 31 is provided with a plurality of via holes 34, inside which a conductive substance 33 is filled, as vertical conductive sections right under pad portions 35. Thereby, the conductive substance 33 electrically connects to the pad portions 35. On the pad portions 35; the semiconductor package 8 (or 9) is mounted via solder bumps 36. The via hole 34 may be a non-feed through via hole connecting between a middle conductive layer inside the substrate and a conductive layer on the surface layer, or it may be a full feed through via hole (through hole) extending though the entire substrate.

In the printed wiring board 31 according to the present embodiment thus structured, since a conductive substance is filled in each of the via holes 34, and the pad portions 35 for mounting the semiconductor packages 8 and 9 are disposed right above the via holes 34, the vertical conductive sections made of the conductive substance are not affected by the impedance due to the fiber component in the insulating layer, and shows excellent signal transmission characteristics.

Figure 8:
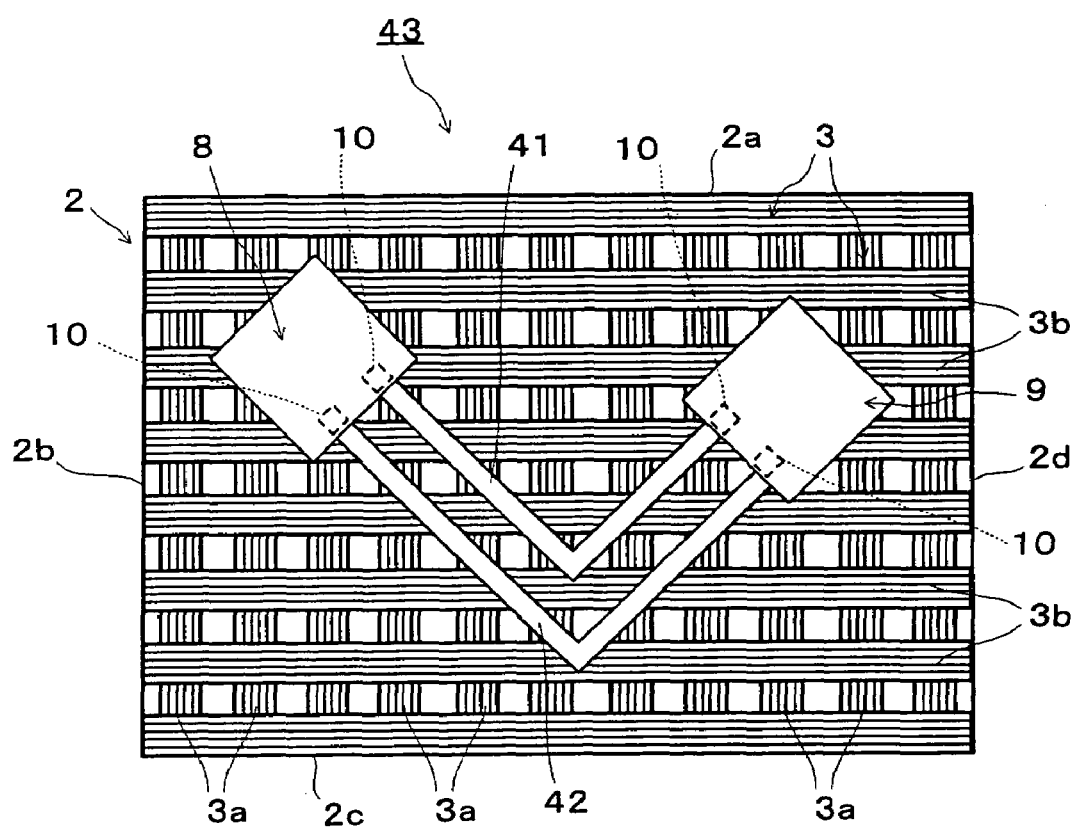
FIG. 8 is a plan view showing a printed wiring board provided with a V-shaped wiring pattern formed of two portions having different obliquely-crossing angles with respect to the direction of fiber with each other.
Figure 9:
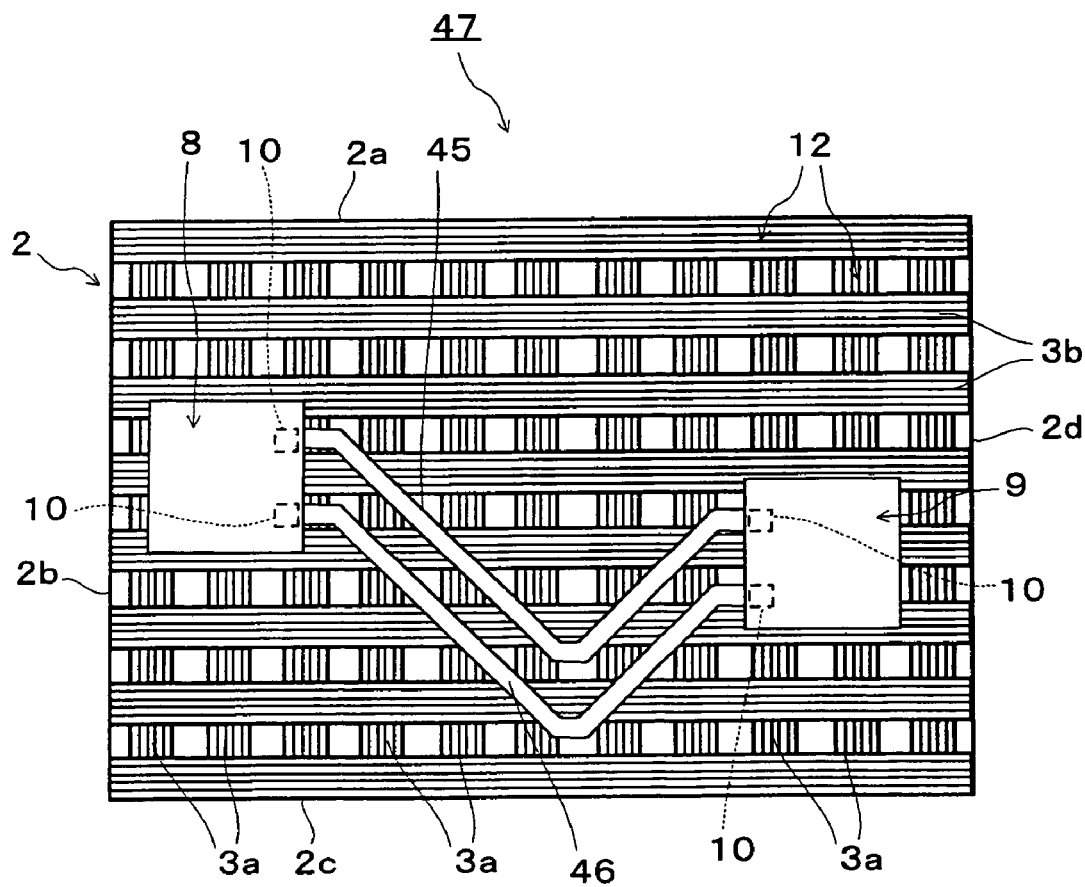
FIG. 9 is a plan view showing a printed wiring board on which a wiring pattern composed of two portions having different obliquely-crossing angles with respect to the direction of fiber with each other and portions without an obliquely crossing are formed.

The present invention has been concretely explained according to various embodiments, but the present invention is not limited to these embodiments, and it is possible to variously modify it without deviating from its outline. For instance, it may be a printed wiring board 43 on which a V-shaped wiring pattern 41 (or 42) is formed of two parts having different slantly-crossing angles with respect to the direction of the fiber direction with each other as shown in FIG. 8. It may also be a printed wiring board 47 provided with a wiring pattern 45 (or 46) formed of two parts having different slantingly-crossing angles with respect to the fiber direction with each other, and a part without slant crossings as shown in FIG. 9. In this case, it is possible to mount the semiconductor packages 8 and 9 in parallel with the sides of the substrate body. It should be noted that, when the printed wiring board 47 is adopted, in order to restrain the above-described effect of the impedance, it is desirable to make the length of wiring without a part crossed slantingly with the fiber direction as short as possible. By applying the printed wiring boards 43, 47 and the like shown in FIG. 8 and FIG. 9, a degree of freedom in a layout of parts to be mounted or wirings can be increased.

In the embodiments described above, the insulating layer 3 having bi-directional fiber components in which the fiber components in the layer intersect at right angles respectively in a grid pattern is shown as an example, but instead of this, an insulating layer in which the fiber components is, for instance, a mono-directional one can also be formed as a printed wiring board. In that event, wiring may be performed by intersecting the wiring pattern at right angles to a mono-directional fiber direction. Although there is no specific description about the number of wiring layers in the above-described embodiments, needless to say, even a multi-layered printed wiring board having four or eight wiring layers may be adopted.

Figure 10:
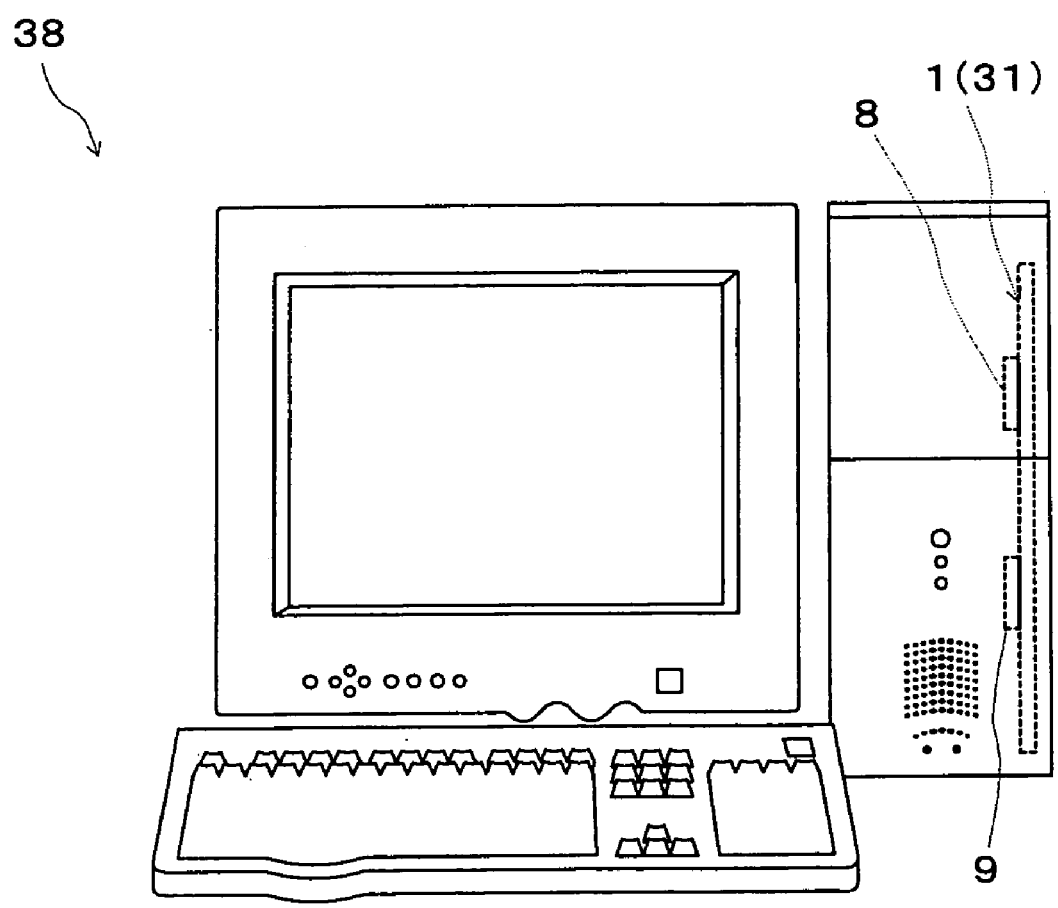
FIG. 10 is a view showing an information processing apparatus on which the printed wiring board shown in FIG. 1 or 7 is mounted.

Further, as shown in FIG. 10, it is possible to form an information processing apparatus designed to have a stable data transmission performance inside the apparatus by installing the printed wiring board 1 or 31 explained in the first and second embodiments as examples.

It is to be understood that the present invention is not intended to be limited to the specific modes which are described here using the drawings, and that all changes which come within the meaning and range of equivalency of the following claims are intended to be embraced therein.

What is claimed is:

1. A printed wiring board, comprising:
    an insulating layer having a shape of a rectangle and provided with a fiber therein, a direction of the fiber being almost parallel to a side of the rectangle;

a reference potential layer disposed on a first surface of the insulating layer;

a plurality of wiring patterns for signal transmission disposed on a second surface of the insulating layer, an entire of each of the plural wiring patterns being in contact with the second surface of the insulating layer, and directions of the plural wiring patterns having in a plan view nearly similar obliquely-crossing angles with respect to the direction of the fiber in the insulating layer; and a pad portion to mount a semiconductor device, disposed on the second surface of the insulating layer to conduct the plural wiring patterns.

2. The printed wiring board as set forth in claim 1, wherein the pad portion is disposed to mount the semiconductor device at a similar angle as the obliquely-crossing angles of the directions of the plural wiring patterns with respect to the direction of the fiber in the insulating layer.

3. The printed wiring board as set forth in claim 1, wherein the directions of the plural wiring patterns have obliquely-crossing angles of nearly 45 degrees with respect to the direction of the fiber in the insulating layer.

4. The printed wiring board as set forth in claim 1, further comprising:

a vertical conductive section provided in a vertical direction in the insulating layer right under the pad portion, and filled with a conductive substance.

5. The printed wiring board as set forth in claim 1, wherein the plural wiring patterns have first portions and second portions, in which directions of the first portions make angles of approximately 90 degrees with respect to directions of the second portions.

6. The printed wiring board as set forth in claim 5, wherein the plural wiring patterns further include third portions, in which directions of the third portions are approximately similar to the direction of the fiber in the insulating layer.

7. An information processing apparatus, comprising:

a printed wiring board which comprises:

an insulating layer having a shape of a rectangle and provided with a fiber therein, a direction of the fiber being almost parallel to a side of the rectangle;

a reference potential layer disposed on a first surface of the insulating layer;

a plurality of wiring patterns for signal transmission disposed on a second surface of the insulating layer, an entire of each of the plural wiring patterns being in contact with the second surface of the insulating layer, and directions of the plural wiring patterns having in a plan view nearly similar obliquely-crossing angles with respect to the direction of the fiber in the insulating; and a pad portion to mount a semiconductor device, disposed on the second surface of the insulating layer to conduct the plural wiring patterns.

* * * * *